(12) United States Patent
Parker et al.

(10) Patent No.: US 6,316,164 B1
(45) Date of Patent: Nov. 13, 2001

(54) PROXIMITY EFFECT CORRECTION METHOD THROUGH UNIFORM REMOVAL OF FRACTION OF INTERIOR PIXELS

(76) Inventors: N. William Parker, 2611 Burrell Dr., Fairfield, CA (US) 94533; Daniel L. Cavan, 7 Orchard Hill Rd., Woodside, CA (US) 94062; Alan D. Brodie, 998 Van Auken Cir., Palo Alto, CA (US) 94303; John H. McCoy, 230 Hillcrest Rd., San Carlos, CA (US) 94070

( * ) Notice: Subject to any disclaimer, the term of this patent is extended or adjusted under 35 U.S.C. 154(b) by 0 days.

(21) Appl. No.: 09/527,062

(22) Filed: Mar. 16, 2000

Related U.S. Application Data

(60) Provisional application No. 60/124,565, filed on Mar. 16, 1999.

(51) Int. Cl.$^7$ ............................... G03C 5/00; A61N 5/00
(52) U.S. Cl. ..................... 430/296; 430/942; 250/492.2; 250/492.22; 250/492.3
(58) Field of Search .................................. 430/296, 942; 250/492.2, 492.22, 492.3

(56) References Cited

U.S. PATENT DOCUMENTS

| | | |
|---|---|---|
| 4,520,269 | 5/1985 | Jones ................................ 250/492.2 |
| 5,051,598 | 9/1991 | Ashton et al. ..................... 250/492.2 |
| 5,103,101 | 4/1992 | Berglund et al. ................. 250/492.2 |
| 5,313,068 | 5/1994 | Meiri et al. ..................... 250/492.22 |
| 5,393,987 | 2/1995 | Abboud et al. ................. 250/492.22 |
| 5,736,281 | 4/1998 | Watson ................................... 430/30 |

OTHER PUBLICATIONS

Owen et al., "Application of the Ghost proximity effect . . . ", J. Vac. Sci. Technol. B 3(1), Jan./Feb. 1985, pp. 153–158.

MA et al., "Proximity corrections in a rasterscan . . . ", J. Vac. Sci. Technol. 19(4), Nov./Dec. 1981 pp. 1275–1278.

Parikh, "Corrections to proximity effects in . . . ", J. Appl. Phys. 50(6). Jun. 1979, pp. 4371–4377.

*Primary Examiner*—Christopher G. Young
(74) *Attorney, Agent, or Firm*—John M. Macaulay

(57) ABSTRACT

A proximity effect correction method for electron beam lithography suitable for use in a raster scan system. The exposure pattern consists of shapes; these shapes are subdivided into edge pixels and interior pixels; the pattern is then modified by uniformly removing a fraction of the interior pixels. The method reduces the backscattered electron background dose, improving the contrast for shapes with fine features, particularly when they are in close proximity to large or densely packed shapes.

5 Claims, 3 Drawing Sheets

PROXIMITY EFFECT CORRECTION METHOD THROUGH UNIFORM REMOVAL OF FRACTION OF INTERIOR PIXELS

CROSS-REFERENCE TO RELATED APPLICATIONS

This application claims the benefit of U.S. Provisional Application No. 60/124,565 filed Mar. 16, 1999.

BACKGROUND OF THE INVENTION

1. Field of the Invention

This invention relates to the field of electron beam lithography and more specifically to a method of correcting for proximity effects in exposure patterns.

2. Description of the Related Art

In the field of electron beam lithography it is necessary to correct for the background dose effect of back scattered electrons. The pattern in the electron-sensitive resist is defined by the dose of the finely focussed incident electron beam at the various points of the pattern on the surface. Most of the electrons pass into the bulk of the substrate and scatter. A fraction of the scattered electrons come back to the surface and exit. As they exit they also provide a background dose to parts of the pattern that are distant from the incident beam. At any given point, the cumulative effect of this background, from all the other points that receive an incident dose, can create an improper exposure. The resist will not develop properly and shapes will have the wrong dimensions. The only methods available for compensation are to change the incident dose (current per area) or to modify the shape dimensions. This is proximity effect correction or PEC. The correction depends upon the dose given the other shapes or points in proximity to the point being corrected.

The traditional PEC takes into account the actual shapes in the pattern (which includes their density and critical dimensions) and the range of the back scattered electrons. The background dose from back scattered electrons decreases exponentially from the primary beam. This exponential dependence is best determined empirically. It increases with the incident electron energy and is inversely related to the atomic number of the substrate. Most early electron beam patterning systems used relatively low electron beam energy, for example 10 keV. The backscatter range was the same order as the patterns being reproduced, with shapes 1 $\mu$m or larger. In this case the background dose varies from the interior to the exterior edges of each shape. To achieve proper exposure Jones, U.S. Pat. No. 4,520,269, and Meiri et al., U.S. Pat. No. 5,313,068, show how to divide the shapes into smaller features so that the edges can be given a higher dose than the interiors. The purpose is to get the dose correct at the edge so as to achieve the proper position of the developed resist.

Most of the PEC methods apply Mihir Parikh's method of self-consistency (M. Parikh, J. Appl. Phys. 50(6) June 1979 p. 4371). This method requires the following Desired dose ($K$)=Incident Dose ($C$)+Backscatter ($S$)

or $K=C+S$ to be achieved. The desired dose gives the proper resist exposure. It is found by process experiments. The incident dose is the only parameter under direct control. The backscatter dose must be calculated by integrating all the incident doses at proximal points, taking into account the exponential decrease of the backscatter dose with distance. After the backscatter is calculated, the incident dose is changed to achieve the desired dose. Unfortunately, this changes the backscatter calculation. Thus, iterative calculations must be performed until the incident dose changes insignificantly with each iteration. There has been much work and invention to achieve this calculation. Watson, U.S. Pat. No. 5,736,281, changed a factor so that the equation became $K=\frac{1}{2}C+S$ This change improves the exposure of isolated shapes where the backscatter dose is very low.

The precalculated doses are best applied to vector or vector/shaped electron beam systems that allow dose variations with each shape, or subdivision of a shape, written. Raster scan systems such as the Etec Systems MEBES can not achieve these graded levels of exposure. Each pixel is either on or off during a single pass. Thus the incident dose can not be modulated over a range of values for each pixel. Four overlaying passes of the raster can be used to write the pattern while turning on or off individual pixels to achieve pixel doses of 0, 0.25, 0.50, 0.75, or 1.0 (S. Ma, M. Parikh, and W. Ward, J. Vac. Sci. 19(4), Nov/Dec 1981 p. 1275). Four passes reduce the throughput to 25%, a significant disadvantage. This coarse five-level control is often insufficient for PEC.

The GHOST method can also be applied with raster scan (G. Owen, P. Rissman, and M. Long, J. Vac. Sci. B3 (1) Jan/Feb 1985, p. 153). The GHOST method requires two passes, for a throughput cut in half. It works by making the background dose uniform throughout the pattern. This means that an isolated shape, that would have had low background and therefore high contrast, ends up with lowered contrast. Such isolated shapes could be the most critical and are thus degraded.

The concept of making the backscatter background dose more uniform is partially achieved by employing electron beam energies above 50 keV. The backscatter exponential range is then greater than 10 $\mu$m, much larger than the pattern shapes that are much less than 1 $\mu$m. Thus the PEC does not vary within a shape and the shape partitioning of Meiri et al., U.S. Pat. No. 5,313,068, is not necessary. This is recognized in Ashton et al., U.S. Pat. No. 5,051,598, which used a coarse grid (greater than the shapes) to calculate PEC. Several adjacent shapes within the grid could have the same correction.

None of these PEC techniques seek to reduce the backscatter dose background when large or densely packed shapes exist near shapes with fine features. At high beam energy, the dose in the center of the large or densely packed shapes contributes background to the fine shapes that may be 1 to 5 $\mu$m distant. This lowers the contrast for the shapes with fine features and decreases process latitude. A large process latitude is highly desirable for the use of electron beam lithography processes in industry, for example the semiconductor industry. Therefore, there is a need for PEC techniques that can offer an improvement in process latitude, preferably without impacting throughput.

SUMMARY OF THE INVENTION

This invention is a method of proximity effect correction for electron beam lithography. Start with an exposure pattern, which consists of a plurality of shapes. The shapes in the pattern are subdivided into pixels, both edge and interior pixels. The exposure pattern is then modified by removing a fraction of the interior pixels in a spatially uniform manner. This modified pattern is then written with a focused electron beam on a suitable object coated in an electron sensitive material, known as a resist. The method of the invention allows the background dose for backscattered electrons to be reduced; this method is effective for shapes with fine features, even when they are in close proximity to large or densely packed shapes.

According to aspects of the invention the exposure pattern may be modified utilizing the following approach: a coordinate array A(X,Y) is defined for the pixels, where X and Y are integers; interior pixels are removed according to whether the sum of X and Y is an even or an odd integer, for example all interior pixels for which X+Y is an odd integer are removed—this approach provides for very uniform removal.

DETAILED DESCRIPTION

Figure 1:
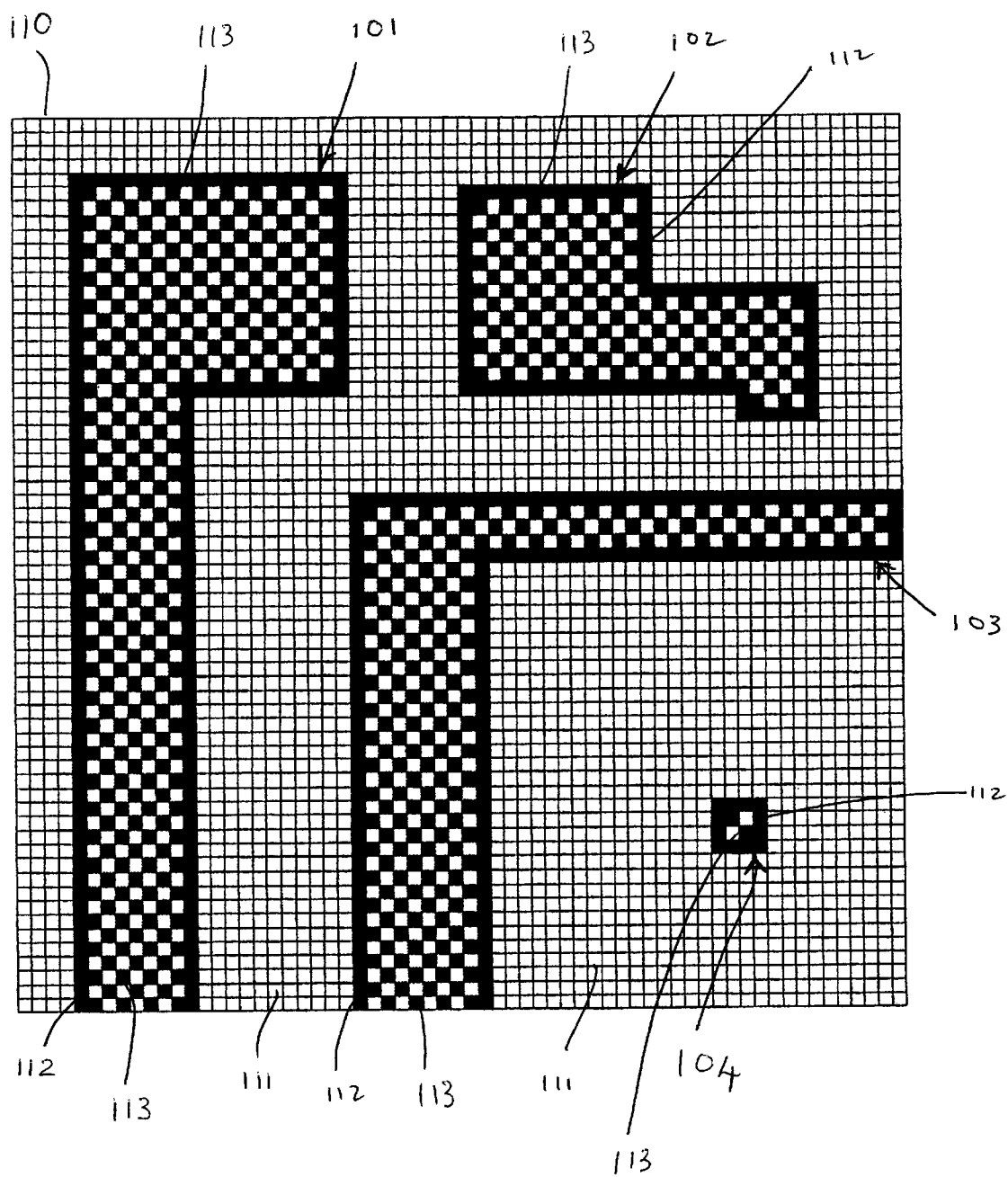
FIG. 1 shows a first exposure pattern according to the invention.

FIG. 1 shows part of an exposure pattern according to the invention. The pattern contains shapes 101, 102, 103 and 104. A pixel grid 110 is shown, where patterned pixels are black and unpatterned pixels are white. There are 3 categories of pixel: exterior pixels 111, outside of any shape, edge pixels 112, at the edge of a shape, and interior pixels 113, inside a shape.

Figure 2:
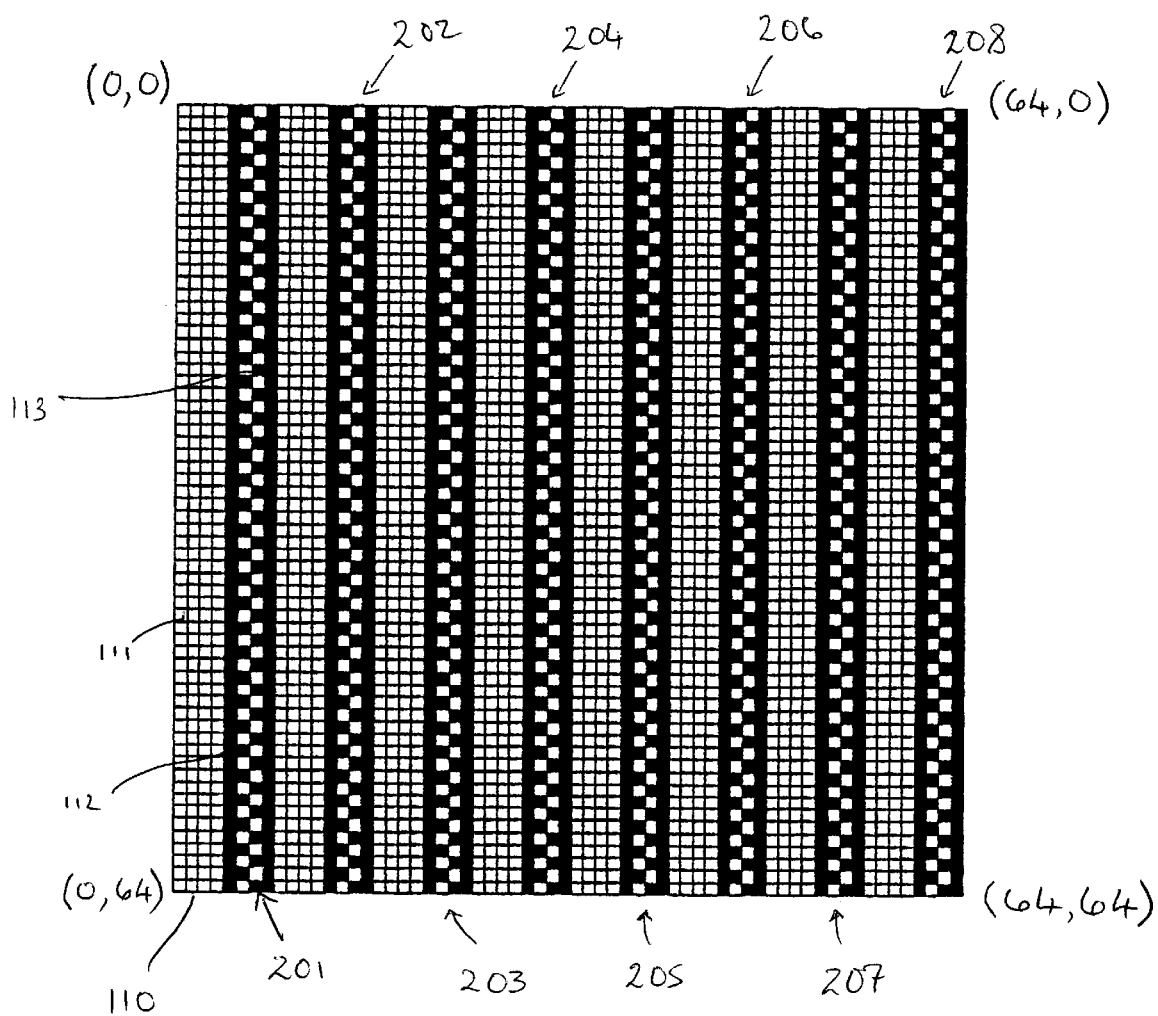
FIG. 2 shows a second exposure pattern according to the invention.

FIG. 2 shows a different example of part of an exposure pattern according to the invention. The pattern contains identical shapes 201 through 208. The 3 types of pixel 111, 112 and 113, and the pixel grid 110 are shown. The pixel grid can be defined using a coordinate array A(X,Y), where X and Y are integers; in FIG. 2 the array consists of 64×64 pixels and the coordinates of the corners are specified.

Figure 3:
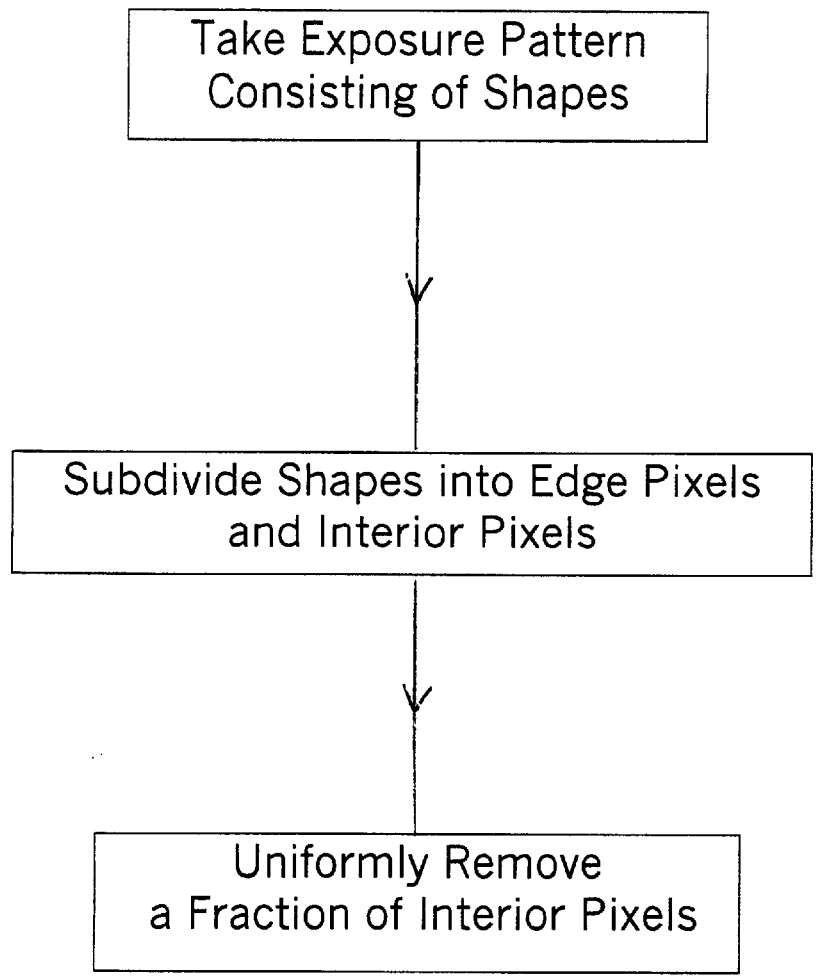
FIG. 3 shows a flow chart for the method of the invention.

FIG. 3 shows a flow chart outlining the method of the invention. The method has the following steps:

start with an exposure pattern, which consist of a plurality of shapes;

the shapes in the pattern are subdivided into edge pixels and interior pixels;

the exposure pattern is then modified by uniformly removing a fraction of the interior pixels.

Both FIGS. 1 and 2 show examples of this method.

A further embodiment of this method is to modify the exposure pattern by removing the interior pixels according to whether the sum of their coordinates, as defined by a coordinate array A(X,Y), are either even or odd integers; in FIG. 2 the interior pixels for which X+Y is an even integer have been removed.

Another embodiment of the method is to uniformly remove a fraction of the interior pixels where the fraction is ½. Both FIGS. 1 and 2 are examples of this embodiment.

The pixels are shown to be square in both FIGS. 1 and 2; these pixels may typically be 25 nm on a side when the exposure pattern is being used in a high resolution electron beam lithography tool. The method of this invention may be used with raster scan electron beam lithography tools, which have focused electron beams capable of writing the pixel size in the exposure pattern.

The exposure pattern may be in a compacted form for use with a lithography tool, for example the GDSII data format may typically be used. The type of modified exposure patterns shown in FIG. 2, generated using the method of this invention, may be incorporated into the GDSII format in an efficient way—these modified data files need not have to be stored as inefficiently large pixel data files.

The method of this invention can be effectively combined with the recursive PEC methods of the type described by Parikh (M. Parikh, J. Appl. Phys. 50(6) June 1979 p. 4371).

What is claimed is:

1. A method of correcting proximity effects in an exposure pattern for electron beam lithography, the exposure pattern consisting of a plurality of shapes, the method comprising the steps of:

subdivision of the shapes into edge pixels and interior pixels; and modification of the exposure pattern by uniformly removing a fraction of the interior pixels.

2. The method of claim 1, wherein the modification step comprises:

defining a coordinate array A(X,Y) for the pixels, where X and Y are integers; and removing interior pixels for which X+Y is an even integer.

3. The method of claim 1, wherein the modification step comprises:

defining a coordinate array A(X,Y) for the pixels, where X and Y are integers; and removing interior pixels for which X+Y is an odd integer.

4. The method of claim 1, wherein the fraction is ½.

5. The method of claim 1, wherein the pixels are square and measure 25 nm on a side.

* * * * *